United States Patent [19]
Whight

[11] Patent Number: 5,714,797
[45] Date of Patent: Feb. 3, 1998

[54] VARIABLE CAPACITANCE SEMICONDUCTOR DIODE

[75] Inventor: Kenneth R. Whight, Horsham, Great Britain

[73] Assignee: U.S. Philips Corporation, New York, N.Y.

[21] Appl. No.: 855,069

[22] Filed: May 13, 1997

Related U.S. Application Data

[63] Continuation of Ser. No. 516,905, Aug. 18, 1995, abandoned.

[30] Foreign Application Priority Data

Aug. 20, 1994 [GB] United Kingdom ............... 9416900

[51] Int. Cl.$^6$ .................................................. H01L 29/93
[52] U.S. Cl. ..................................... 257/601; 257/598
[58] Field of Search ................................ 257/601, 598

[56] References Cited

U.S. PATENT DOCUMENTS

| | | | |
|---|---|---|---|
| 3,411,053 | 11/1968 | Wiesner | 257/601 |
| 3,506,888 | 4/1970 | Siebertz et al. | 317/234 |
| 3,612,964 | 10/1971 | Kawazu | 257/601 |
| 3,890,635 | 6/1975 | Engeler | 257/601 |
| 4,399,417 | 8/1983 | Ballantyne et al. | 257/601 |

Primary Examiner—Stephen Meier
Attorney, Agent, or Firm—Steven R. Biren

[57] ABSTRACT

A semiconductor body has a first region of one conductivity type coupled to a first electrode. A second region of the opposite conductivity type is coupled to a second electrode and is provided within the first region to form a first pn junction with the first region. At least one further region of the opposite conductivity type is formed within the first region and spaced from the second region so as to form a further pn junction with the first region with each of the first and further pn junctions making a contribution to the capacitance of the diode. This capacitance varies during operation of the diode with a reverse-biasing voltage applied between the first and second electrodes. A coupling region of the opposite conductivity type and more lowly doped than the second and further regions provides a resistive path for free charge carriers of the opposite conductivity type between the second and further region and is sufficiently lowly doped that when a reverse-biasing voltage applied between the first and second electrodes reaches a predetermined value, at least part of the coupling region becomes depleted of free charge carriers to interrupt the resistive path and thereby resistively decouple the second and further region so that the capacitive contributions of the first and further pn junctions are no longer coupled in parallel with one another by the resistive path and the overall capacitance of the diode is reduced.

15 Claims, 2 Drawing Sheets

VARIABLE CAPACITANCE SEMICONDUCTOR DIODE

This is a continuation of application Ser. No. 08/516,905, filed Aug. 18, 1995 now abandoned.

BACKGROUND OF THE INVENTION

This invention relates to a variable capacitance semiconductor diode comprising a semiconductor body having a first region of one conductivity type coupled to a first electrode, a second region of the opposite conductivity type coupled to a second electrode and provided within the first region to form a first pn junction with the first region, at least one further region of the opposite conductivity type formed within the first region spaced from the second region so as to form a further pn junction with the first region with each of the first and further pn junctions making a contribution to the capacitance of the diode, which capacitance varies in operation of the diode with a reverse-biasing voltage applied between the first and second electrodes.

U.S. Pat. No. 3,506,888 describes such a variable capacitance semiconductor diode. As indicated in that U.S. Patent, the capacitance of a reverse-biased pn junction decreases with an increase in the reverse-biasing voltage because of the increase in the width of the depletion or space charge region. In U.S. Pat. No. 3,506,888, a multiplicity of regions of the opposite conductivity type are formed in a grid-like arrangement within the first region. The multiplicity of opposite conductivity type regions are electrically connected in parallel. In operation of the variable capacitance semiconductor diode described in U.S. Pat. No. 3,506,888, when an increasing reverse-biasing voltage is applied between the first and second electrodes, the depletion regions of the respective reverse-biased pn junctions grow until they merge to form a single depletion region at which time the overall area of the boundary or periphery of the depletion region will have, of course, reduced so resulting in a reduction in the overall capacitance. As the depletion region spreads still further with increasing reverse-biasing voltage, the merged areas of the depletion region will tend to flatten out so further reducing the capacitance.

SUMMARY OF THE INVENTION

It is an aim of the present invention to provide a variable capacitance semiconductor diode which uses a different approach to facilitating a change of capacitance with voltage and should enable a greater, more distinct change in capacitance with increasing voltage.

According to the present invention, there is provided a variable capacitance semiconductor diode comprising a semiconductor body having a first region of one conductivity type coupled to a first electrode, a second region of the opposite conductivity type coupled to a second electrode and provided within the first region to form a first pn junction with the first region, at least one further region of the opposite conductivity type formed within the first region spaced from the second region so as to form a further pn junction with the first region with each of the first and further pn junctions making a contribution to the capacitance of the diode, which capacitance varies in the operation of the diode with a reverse-biasing voltage applied between the first and second electrodes, characterised in that a coupling region of the opposite conductivity type and more lowly doped than the second and further regions provides a resistive path for free charge carriers of the opposite conductivity type between the second and further regions and the coupling region is sufficiently lowly doped that, when a reverse-biasing voltage applied between the first and second electrodes reaches a predetermined value during operation of the device, at least part of the coupling region becomes depleted of free charge carriers, so interrupting the resistive path for free charge carriers of the opposite conductivity type between the second and further regions and thereby resistively decoupling the second and further regions so that the capacitive contributions of the first and further pn junctions are no longer coupled in parallel with one another by the resistive path and the overall capacitance of the diode is reduced.

Thus, a variable capacitance semiconductor diode in accordance with the invention provides a relatively high overall junction capacitance at low reverse-biasing voltages when the second and further regions are resistively coupled by the coupling region, but provides a much lower capacitance at higher voltages once the resistive path between the second and further regions is interrupted.

The dimensions of the second and further regions may be selected as desired so as to determine the respective capacitances at low reverse-biasing voltages when the second and further regions are resistively coupled and at high reverse-biasing voltages when the second and further regions are resistively decoupled. This may be achieved by a simple modification of the mask used to form the second and further regions.

As another possibility, two or more further regions may be provided coupled by respective coupling regions, so enabling more flexibility in the design of the variable capacitance semiconductor diode with regard to the manner in which the capacitance changes with a change in the reverse-biasing voltage. Each further region may surround the first pn junction and may be coupled to the adjacent further or second region by a respective coupling region.

The further regions and coupling regions may be arranged so that the coupling region remote from the second region becomes depleted of free charge carriers, so interrupting the resistive path for free charge carriers between the further regions coupled by that coupling region at a lower reverse-biasing voltage than the coupling region adjoining the second region. This should enable abrupt changes of capacitance at two distinct reverse-biasing voltages with the first abrupt change in capacitance occurring at the voltage at which the resistive path provided by the coupling region remote from the second region is interrupted, so decoupling the outer or outermost further region from the remaining second and further regions and the next abrupt change in capacitance occurring at the reverse-biasing voltage at which the resistive path provided by the remaining coupling region or regions become interrupted. Of course, where three or more further regions are provided, then the further regions and coupling regions may be arranged so that the resistive path provided by the outermost coupling region becomes interrupted at a first reverse-biasing voltage, the resistive path provided by the next to outermost coupling region becomes interrupted at a second higher reverse-biasing voltage and so on so that the resistive paths provided by the coupling regions become successively interrupted as the reverse-biasing voltage increases, thereby enabling a larger range of capacitances to be achieved over a given reverse-biasing voltage range.

In order for the coupling region remote from the second region to become depleted of free charge carriers at a lower reverse-biasing voltage than the coupling region adjacent the second region, the coupling region remote from the second region may be more lowly doped than the coupling region adjacent the second region. This may be achieved by, for example, implanting the impurities for forming the coupling regions through a stepped insulating layer with, of course, the more lowly doped coupling region being formed beneath the thickest part of the insulating or masking layer or by introducing the dopants in two or more steps and masking the coupling region desired to be more lowly doped from the second and from any further dopant introduction steps.

As another possible way of causing the coupling region remote from the second region to become depleted of free charge carriers at a lower reverse-biasing voltage than the coupling region adjacent the second region, the further regions adjoining the coupling region remote from the second region may be closer together than the second region and the further region adjacent thereto so that the further coupling region remote from the second region provides a shorter resistive path than the coupling region adjacent the second region. This may be achieved in a relatively simple manner by appropriate design of the mask through which the impurities for the second and further regions are introduced.

The or each coupling region may comprise a relatively lowly doped surface region meeting the first surface and the second and further regions extend further into the semiconductor body from the first major surface than the surface region. Where desired, however, the or each coupling region may have a depth similar to the second and further regions.

BRIEF DESCRIPTION OF THE DRAWING

Embodiments of the present invention will now be described, by way of example, with reference to the accompanying drawings, in which.

It should of course be understood that the drawings are not to scale and that like reference numerals are used throughout the text to refer to like parts.

DESCRIPTION OF THE PREFERRED EMBODIMENTS

Figure 1:
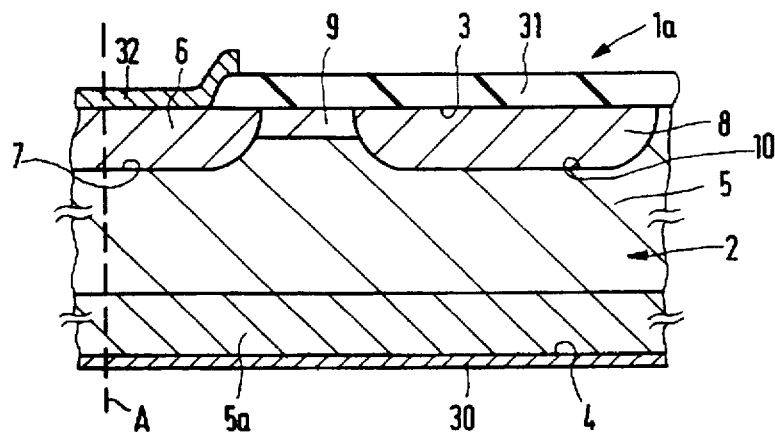
FIG. 1 shows a schematic cross-sectional view through part of one example of a semiconductor diode in accordance with the invention.
Figure 5:
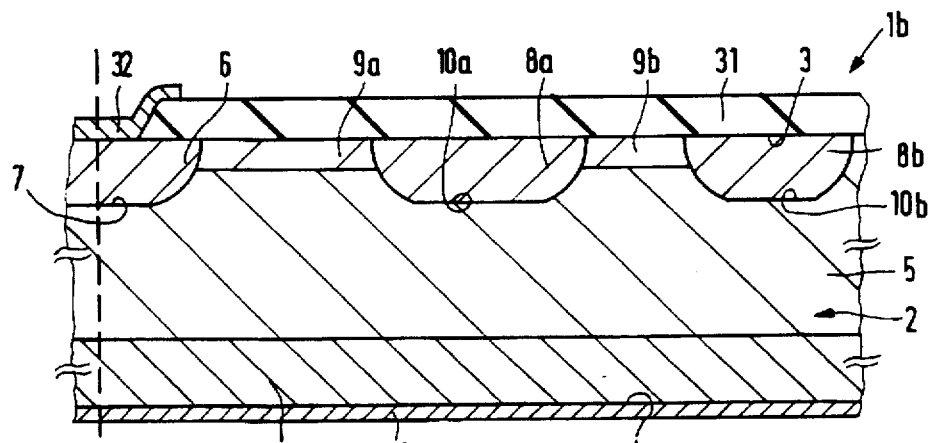
FIG. 5 shows a schematic cross-sectional view through part of another example of a semiconductor diode in accordance with the invention.

Referring now to the drawings, there are illustrated in FIGS. 1 and 5 variable capacitance semiconductor diodes 1a and 1b. In each case, the diode comprises a semiconductor body 2 having a first region 5 of one conductivity type coupled to a first electrode 30, a second region 6 of the opposite conductivity type coupled to a second electrode 32 and provided within the first region 5 to form a first pn junction 7 with the first region 5, at least one further region 8 of the opposite conductivity type formed within the first region 5 spaced from the second region 6 so as to form a further pn junction 10 with the first region 5 with each of the first 7 and further 10 pn junctions making a contribution to the capacitance of the diode, which capacitance varies in operation of the diode with a reverse-biasing voltage applied between the first and second electrodes 30 and 32. In accordance with the invention, a coupling region 9 of the opposite conductivity type and more lowly doped than the second and further regions 6 and 8 provides a resistive path for free charge carriers of the opposite conductivity type between the second and further regions 6 and 8 and is sufficiently lowly doped that, when a reverse-biasing voltage applied between the first and second electrodes 30 and 32 reaches a predetermined value during operation of the device, at least part of the coupling region 9 becomes depleted of free charge carriers so interrupting the resistive path for free charge carriers of the opposite conductivity type between the second and further regions 6 and 8 and thereby resistively decoupling the second and further regions 6 and 8 so that the capacitive contributions of the first 7 and further 10 pn junctions are no longer coupled in parallel with one another by the resistive path and the overall capacitance of the diode is reduced.

Thus, a variable capacitance semiconductor diode in accordance with the invention provides a relatively high overall junction capacitance at low reverse-biasing voltages when the second and further regions are resistively coupled by the coupling region, but provides a much lower capacitance at higher voltages once the resistive path between the second and further regions is interrupted.

FIG. 1 illustrates a cross-sectional view through part of one example of a variable capacitance semiconductor diode 1a in accordance with the invention. In the example shown in FIG. 1, the semiconductor device 1a comprises a vertical two-terminal diode structure which in effect forms a capacitor.

In the two-terminal diode structure shown in FIG. 1, the first region 5 is relatively lowly doped region and ohmic contact is made to an electrode 30 provided on the second major surface 4 of the semiconductor body 2 by way of a relatively highly doped region 5a of the one conductivity type. Generally, the first region 5 is of n conductivity type while the second region 6 is of p conductivity type. The second region 6 is formed, together in this example with one further region 8, by diffusion of suitable impurities, generally boron through an appropriate mask provided on the first major surface 3. An insulating layer 31 is provided on the first major surface 3 and a window is formed in that insulating or passivating layer 31 to enable ohmic contact to be made to the second region 6 by subsequently deposited metallisation which is patterned to define an electrode 32. The electrodes 30 and 32 thus form the cathode and anode, respectively, of the diode structure.

As can be seen clearly from FIG. 1, the second and further regions 6 and 8 are coupled by a relatively lowly doped coupling region 9 of the same conductivity type, that is p conductivity type in the example being described. The region 9 may be formed by introduction of appropriate impurities into the first major surface 3 either before or after formation of the second and further regions 6 and 8. As one possible alternative, the coupling region 9 may be formed as an epitaxially deposited layer. As can be seen from FIG. 1, the second and further region 6 and 8 extend further into the first region 5 than the coupling region 9, that is the coupling region 9 is more shallow than the second and further regions 6 and 8. However, if desired, the coupling region 9 could have a depth similar to that of the second and further regions 6 and 8. The semiconductor diode 1a shown in FIG. 1 may be rotationally symmetrical about the axis A.

Figure 2:
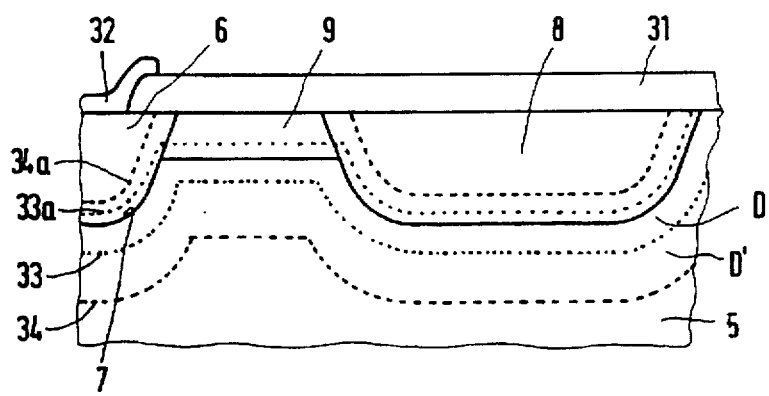
FIG. 2 shows a sketch for explaining the operation of the diode shown in FIG. 1.

The operation of the semiconductor device 1a shown in FIG. 1 will now be described with the help of FIGS. 2 to 4, with FIG. 2 showing a portion of the semiconductor body structure of the device 1a with the cross-hatching omitted in the interest of clarity.

When the reverse-biasing voltage V across the pn junction 7 is relatively low, then the spread of the depletion region D will be quite small as indicated by the dashed lines 33 and 33a in FIG. 1, which show the boundaries of the depletion region at this voltage. The junction capacitance $C_T$ will be quite high, as indicated in FIG. 3, because, at this stage, the capacitance $C_2$ of the pn junction 10 is coupled in parallel with the capacitance $C_1$ of the pn junction 7 so that the total junction capacitance is $C_T=C_1+C_2$. As indicated above in relation to FIG. 1, the depletion region D of course spreads further into the more lightly doped first region 5 and more lightly doped coupling region 9 than into the relatively highly doped second and further regions 6 and 8. As the reverse-biasing voltage V across the pn junction 7 increases, so the depletion region $D^1$ widens and thus, as indicated diagrammatically by the line X in FIG. 3, the capacitance $C_T$ decreases. As the reverse-biasing voltage across the pn junction 7 increases still further, the depletion region D will widen still further until, at a predetermined voltage $V_d$ in FIG. 3, the depletion region $D^1$ extends as shown by the dotted lines 34 and 34a in FIG. 2 throughout the entire thickness of the coupling region 9 so interrupting the resistive path provided between the second region 6 and the further region 8 by the coupling region 9 and therefore resistively decoupling the second and further regions 6 and 8. At this stage the capacitances $C_1$ and $C_2$ are no longer connected in parallel, but rather are capacitively coupled in series with the total capacitance $C_t$ being given by approximately:

$$\frac{C_1 C_2}{C_1 + C_2}$$

Figure 3:
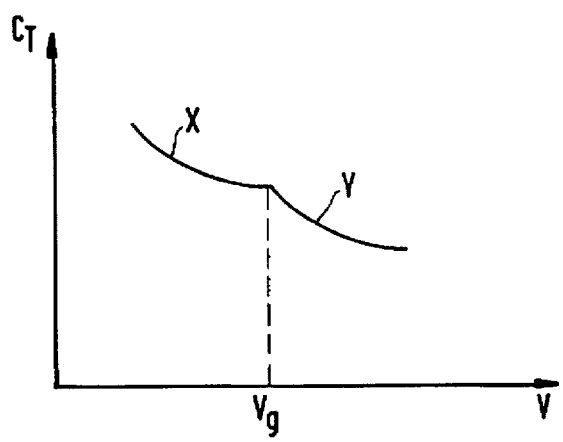
FIG. 3 shows a graph illustrating roughly the relationship between the reverse-biasing voltage V across the semiconductor diode shown in FIG. 1 and its capacitance C.
Figure 4:
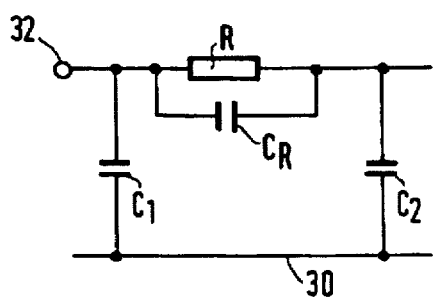
FIG. 4 is an equivalent circuit diagram for the semiconductor diode shown in FIG. 1.

Accordingly, there is a marked or abrupt change in the manner in which the total capacitance $C_T$ is decreasing as indicated in FIG. 3 at the predetermined voltage $V_g$. With a further increase in the reverse-biasing voltage, the depletion region D continues to widen and the total capacitance $C_T$ will continue to decrease, but now following the curve Y in FIG. 3. The existence of the marked change at the voltage $V_g$ in the way in which the overall capacitance $C_T$ is decreasing should enable a larger range of capacitance values for a given voltage range.

Thus, in the operation of the semiconductor diode 1a shown in FIG. 1, when the reverse-biasing voltage across the pn junction 7 is relatively low, the coupling region 9 provides a resistive electrical path between the second and further regions 6 and 8 so resulting in, effectively, an extension of the pn junction 7 along the further regions 8 and so forming a large area junction capacitance. Effectively at this stage the diode 1a is equivalent to the circuit shown in FIG. 4 in which R is the resistance of the coupling region 9 and $C_R$ its capacitance. As the reverse-biasing voltage increases, the relatively lowly doped coupling region 9 becomes depleted, so separating the second and further regions 6 and 8 from one another. Once the coupling region 9 becomes depleted the resistance R is removed and the coupling region 9 just forms a low capacitance $C_R$ layer in series with the, effectively, floating capacitance provided by the further region 8. The further region 8 therefore no longer makes a significant contribution to the junction capacitance and accordingly there is an abrupt change in the manner in which the overall capacitance is decreasing as shown in FIG. 3.

The actual reverse-biasing voltage $V_g$ across the pn junction 7 at which the coupling region 9 will become depleted will, of course, depend on the separation of the second and further regions 6 and 8 and also on the actual doping of the coupling region 9. The spacing between the second and further regions 6 and 8 and the doping concentration of the coupling region 9 may be adjusted so as to adjust the reverse-biasing voltage at which the coupling region 9 becomes depleted and thus the voltage at which the second and further regions 6 and 8 become isolated. An advantage of a variable capacitance semiconductor diode in accordance with the invention is that the relative sizes of the areas of the pn junctions 7 and 10 can be adjusted relatively simply by appropriate mask modification during the manufacture of the semiconductor diode so as to adjust the relative values of the capacitances $C_1$ and $C_2$ and thereby to effect the manner in which the overall capacitance $C_T$ changes with a change in the reverse-biasing voltage V.

A variable capacitance semiconductor diode in accordance with the invention may be used to form, for example, a so-called varicap diode in part of a frequency tuning circuit for, for example, a radio, TV or similar receiver. In such a variable capacitance semiconductor diode, the second and further regions 6 and 8 may typically have a junction depth of about 1 micrometer and the separation of the second and further region 6 and 8 may be of the same order.

FIG. 5 shows a further example of a semiconductor diode 1b in accordance with the invention in which two further regions 8a and 8b are provided with the inner further region 8a being coupled to the second region 6 by a first coupling region 9a and the outer region 8b being coupled to the inner further region 8a by a second coupling region 9b. As shown in FIG. 5, the two further regions 8a and 8b are closer together than the second region 6 and the inner further region 8a so that the outer coupling region 9b is shorter than the inner coupling region 9a. This means that, assuming the two coupling regions 9a and 9b have the same dopant concentration, the effect of the closeness of the further regions 8a and 8b will, in a manner analogous to pinch-off effects in JFETs and short-channel effects in MOSFETs, cause the depletion region to spread more quickly throughout the depth of the outer shorter coupling region 9b so that the resistive path provided by the outer shorter coupling region 9b is interrupted at a lower reverse-biasing voltage than the resistive path provided by the inner coupling region 9a. This is illustrated schematically by FIGS. 6 and 7 which show, respectively, a portion of the semiconductor body structure of the device 1b with the cross-hatching omitted and a schematic graph of the total junction capacitance $C_T$ of the semiconductor diode 1b against the reverse-biasing voltage V between the first and second electrodes 30 and 32.

As will be appreciated from a comparison of FIGS. 1 to 3 and 5 to 7, the semiconductor diode 1b is in most respects similar to the semiconductor diode 1a apart from the addition of the second further region 8b and associated coupling region 9b.

Figure 6:
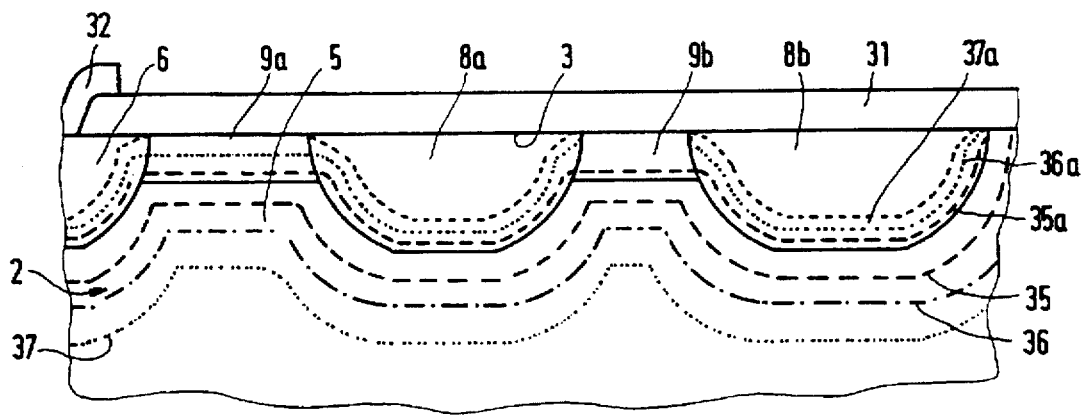
FIG. 6 shows a sketch for explaining the operation of the semiconductor diode shown in FIG. 5.
Figure 7:
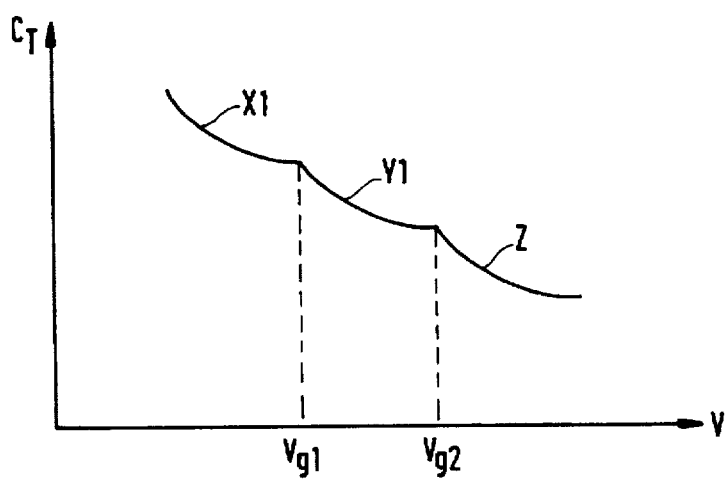
FIG. 7 shows a schematic graph illustrating roughly the relationship between the reverse-biasing voltage V across the semiconductor diode shown in FIG. 4 and its capacitance C.

As indicated by the dashed lines 35 and 35a in FIG. 6 which show the boundaries of the depletion region, when the reverse-biasing voltage V is relatively low, the depletion region width is relatively narrow and the two coupling regions 9a and 9b both still provide resistive conductive paths so that the inner further region 8a is resistively coupled to the second region 6 by the resistive coupling region 9a and the outer further region 8b is resistively coupled to the inner further region 8a by the resistive coupling region 9b. As the reverse-biasing voltage V across the electrodes 30 and 32 increases, the width of the depletion region will increase and, as indicated above, because of short-channel like effects, the depletion region will be pushed further into the relatively short coupling region 9b so that the coupling region 9b becomes depleted of free charge carriers at a lower reverse-biasing voltage than the longer coupling region 9a. The dot-dashed line 36 and 36a in FIG. 6 illustrate the boundaries or extent of the depletion region at a first given reverse-biasing voltage when the shorter outer coupling region 9b has just become depleted of free charge carriers, so resistively decoupling the outer further region 8b from the inner further region 8a. Accordingly, the junction capacitance associated with the outer further region 8b is no longer coupled in parallel with the junction capacitances associated with the second region 6 and the inner further region 8a but rather is, as indicated above in relation to the example of FIG. 1, simply capacitively coupled in series with the junction capacitances associated with the still resistively coupled second and inner further regions 6 and 8a. Accordingly, at this given reverse-biasing voltage $V_{g1}$ there is a marked or abrupt change in the overall junction capacitance as indicated schematically in FIG. 7. Thus, the change in the overall capacitance $C_T$ no longer follows the curve X1 in FIG. 7 but begins to follow the curve Y1 at the voltage $V_{g1}$.

If the reverse-biasing voltage V increases still further, then the depletion region will expand still further until at a second higher given reverse-biasing voltage $V_{g2}$ the inner coupling region 9a will become depleted of free charge carriers, so resistively decoupling the second region 6 from the inner further region 8a. Again, at this second given voltage $V_{g2}$, there will be a marked or abrupt change in the overall junction capacitance $C_T$ because, at this stage, the junction capacitances associated with both the inner and the outer further regions 8a and 8b will no longer be coupled in parallel with the junction capacitance associated with the second region 6 but will be simply capacitively coupled in series with one another and with the junction capacitance associated with the second region 6. Accordingly, the manner in which the overall junction capacitance $C_T$ is decreasing with increasing reverse-biasing voltage V will for the reasons indicated above in relation to FIGS. 1, 2 and 3 change abruptly so that the change in the overall capacitance $C_T$ starts, at the voltage $V_{g2}$, to follow curve Z in FIG. 7.

The semiconductor diode shown in FIG. 5 should enable an even larger capacitance range to be achieved for a given reverse-biasing voltage thereby facilitating an even greater tuning range in frequency tuning circuits incorporating a semiconductor diode in accordance with the invention.

Although the inner and outer further regions 8a and 8b may be of similar dimensions so as to have similar junction area capacitances, this need not necessarily be the case and, for example, the outer further region 8b could present a significantly larger junction area than the inner further region 8a (or vice versa) so as to tailor the manner in which the overall junction capacitance $C_T$ changes as the further regions successfully become resistively decoupled from the second region. Of course, depending upon the desired relationship between the overall junction capacitance $C_T$ and the reverse-biasing voltage V, there may be more than two further regions with associated coupling regions and the arrangement may be such that the further regions become successively resistively decoupled from the outermost to the innermost further region as the reverse-biasing voltage increases.

Although in the examples described above with reference to FIGS. 5 to 7, the further regions are arranged to become successively decoupled by forming the outer coupling region 9b so as to be shorter than the inner coupling region 9a, other methods could be used to ensure that the outer further region 8b becomes decoupled before the inner further region 8a. Thus, for example, the outer coupling region 9b may be formed so as to be more lowly doped than the inner coupling region 9a so that it becomes depleted of free charge carriers more quickly. This difference in the dopant concentration in the coupling regions 9a and 9b may be achieved by, for example, doping the coupling regions in two or more stages and masking the outer coupling region 9b from the second and any further doping stages or by implanting the impurities for forming the coupling regions through a stepped mask or insulating layer so that the outer coupling region 9b is beneath a thicker masking or insulating portion and so does not become so highly doped during the implantation process. Of course, where it is desired that two or more further regions become successively resistively decoupled from the second region 6, then any one or more of the above described or any other suitable techniques for enabling this to happen may be used.

It will of course be appreciated that the conductivity types mentioned above could be reversed and that, moreover, the present invention may be applied to semiconductor materials other than silicon, for example, germanium or combinations of semiconductor materials or even III–V compound semiconductor materials. The present invention may also be applicable to lateral as well as vertical devices.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention.

I claim:

1. A variable capacitance semiconductor diode having only first and second electrodes for applying operating voltages to the diode to vary the capacitance of the diode, which diode comprises a semiconductor body having a first region of one conductivity type coupled to the first electrode, a doped second region of the opposite conductivity type coupled to the second electrode, the second region being provided within the first region to form a first pn junction with the first region, at least one further region of the opposite conductivity type formed within the first region spaced from the second region so as to form a further pn junction with the first region with each of the first and further pn junctions making a contribution to the capacitance of the diode, which capacitance varies in operation of the diode with a reverse-biasing voltage applied between the first and second electrodes, wherein a doped coupling region of the opposite conductivity type and more lowly doped than the second and further regions forms with the first region another pn junction joining the first and further pn junction and provides a resistive path for free charge carriers of the opposite conductivity type between the second and further regions to couple the capacitive contributions of the first and further pn junctions in parallel with one another when a reverse biasing voltage below a predetermined value is applied between the first and second electrodes, and wherein the coupling region is sufficiently lowly doped that, when the reverse-biasing voltage applied between the first and second electrodes reaches the predetermined value during operation of the device, at least part of the coupling region becomes depleted of free charge carriers by the widening of a depletion region from said other pn junction, thereby interrupting the resistive path for free charge carriers of the opposite conductivity type between the second and further regions and thereby resistively decoupling the further region from the second electrode so that the capacitive contributions of the first and further pn junctions are no longer coupled in parallel with one another by the resistive path so that the overall capacitance of the diode is reduced.

2. A semiconductor diode according to claim 1, wherein two or more further regions are provided coupled by respective coupling regions.

3. A semiconductor diode according to claim 2, wherein each further region surrounds the first pn junction and is coupled to the adjacent further or second region by a respective coupling region.

4. A semiconductor diode according to claim 3, wherein the further regions and coupling regions are arranged so that the coupling region remote from the second region becomes depleted of free charge carriers so interrupting the resistive path for free charge carriers between the further regions coupled by that coupling region at a lower reverse-biasing voltage than the coupling region adjoining the second region.

5. A semiconductor diode according to claim 4, wherein the further regions adjoining the coupling region remote from the second region are closer together than the second region and the further region adjacent thereto so that the coupling region remote from the second region provides a shorter resistive path than the coupling region adjacent the second region.

6. A semiconductor diode according to claim 5 wherein each coupling region comprises a relatively lowly doped surface region meeting the first surface, and wherein the second and further regions extend further into the semiconductor body from the first major surface than the surface region.

7. A semiconductor diode according to claim 4, wherein the coupling region remote from the second region is more lowly doped than the coupling region adjacent the second region.

8. A semiconductor diode according to claim 7, wherein the further regions adjoining the coupling region remote from the second region are closer together than the second region and the further region adjacent thereto so that the coupling region remote from the second region provides a shorter resistive path than the coupling region adjacent the second region.

9. A semiconductor diode according to claim 7 wherein each coupling region comprises a relatively lowly doped surface region meeting the first surface, and wherein the second and further regions extend further into the semiconductor body from the first major surface than does the surface region.

10. A semiconductor diode according to claim 2 wherein two of said further regions have different pn junction areas.

11. A semiconductor diode according to claim 2 wherein each coupling region comprises a relatively lowly doped surface region meeting the first surface, and wherein the second and further regions extend further into the semiconductor body from the first major surface than does the surface region.

12. A semiconductor diode according to claim 1, wherein the or each coupling region comprises a relatively lowly doped surface region meeting the first surface and wherein the second and further region extend further into the semiconductor body from the first major surface than the surface region.

13. A semiconductor diode according to claim 1 which is rotationally symmetrical about an axis passing through the second electrode.

14. A semiconductor diode according to claim 1 wherein said first region is separated from the first electrode by a second region of the one conductivity type, wherein the first and second regions of the one conductivity type are relatively lowly doped and highly doped, respectively.

15. A semiconductor diode according to claim 1 wherein the first region is more lightly doped than the second and further regions.

* * * * *